US007714569B2

(12) United States Patent
Li et al.

(10) Patent No.: US 7,714,569 B2
(45) Date of Patent: May 11, 2010

(54) ADAPTOR FOR ELECTRICAL CONNECTOR

(75) Inventors: Jun-Jie Li, Shenzhen (CN); Shih-Fang Wong, Taipei Hsien (TW); Xiao-Bo Zhang, Shenzhen (CN)

(73) Assignees: Hong Fu Jin Precision Industry (ShenZhen) Co., Ltd., Shenzhen City, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 70 days.

(21) Appl. No.: 11/858,123

(22) Filed: Sep. 20, 2007

(65) Prior Publication Data

US 2008/0245566 A1 Oct. 9, 2008

(30) Foreign Application Priority Data

Apr. 5, 2007 (CN) ........................ 2007 1 0200403

(51) Int. Cl.
*G01R 31/28* (2006.01)
*H01R 12/00* (2006.01)

(52) U.S. Cl. ...................................... 324/158.1; 439/73

(58) Field of Classification Search .............. 324/158.1, 324/763–765; 439/55–85, 203, 421, 423–424, 439/430, 442, 585, 730, 741, 877, 878
See application file for complete search history.

(56) References Cited

U.S. PATENT DOCUMENTS 3,692,966 A * 9/1972 Lancaster .................. 200/51.1
4,114,975 A * 9/1978 Weidler ...................... 439/626
4,256,936 A * 3/1981 Lancaster ................ 200/51.07
4,398,780 A * 8/1983 Novotny et al. ............. 439/284
4,582,383 A * 4/1986 Jo et al. ....................... 439/482
4,790,771 A * 12/1988 Kleiner ....................... 439/421
5,226,827 A 7/1993 Corcoles et al.
5,332,397 A * 7/1994 Ingalsbe .................... 439/76.1
5,477,159 A 12/1995 Hamling
6,062,895 A * 5/2000 Lin et al. .................... 439/404
6,196,655 B1 * 3/2001 Hirasawa et al. .............. 347/25
6,468,089 B1 * 10/2002 Hubbard et al. ............... 439/63
6,530,808 B1 * 3/2003 Hosler et al. ................ 439/585
6,808,407 B1 * 10/2004 Cannon ...................... 439/314
6,945,817 B2 * 9/2005 Miyazaki et al. ............ 439/579
6,997,746 B2 * 2/2006 Taylor ........................ 439/585
7,025,628 B2 4/2006 LaMeres et al.
7,044,813 B2 * 5/2006 Amara et al. ............... 439/877
7,049,843 B2 * 5/2006 Yakymyshyn et al. ....... 324/765

(Continued)

*Primary Examiner*—Ha Tran T Nguyen
*Assistant Examiner*—Joshua Benitez
(74) *Attorney, Agent, or Firm*—Frank R. Niranjan

(57) ABSTRACT

An adaptor is for electrically connecting with pins of an electrical connector. The adaptor includes an insulating housing, a pair of crimping connectors, and two connecting members. The insulating housing includes two holes. The crimping connectors are accommodated respectively in the holes. Each crimping connector includes a first crimping portion for electrically connecting to one of the pins and a second crimping portion together formed with the first crimping portion. The connecting members are electrically connected with the crimping connectors respectively. Each connecting member includes a first end, a cable, and a second end. The first end is electrically connected with the second crimping portion. The cable is electrically connected with the first end. The second end is electrically connected with the cable, wherein the second end has a through hole. A testing device for testing the electrical connector is also disclosed.

11 Claims, 3 Drawing Sheets

U.S. PATENT DOCUMENTS 7,410,384 B2 * 8/2008 Shuey ........................ 439/422
7,605,594 B2 * 10/2009 Blades ....................... 324/713
2003/0176085 A1 * 9/2003 Laker ........................ 439/76.1

* cited by examiner

ADAPTOR FOR ELECTRICAL CONNECTOR

BACKGROUND OF THE INVENTION

1. Field of the Invention

The present invention generally relates to an adaptor and a testing device for testing electrical connectors.

2. Description of Related Art

Electrical connectors are widely used in various electronic devices, such as computers, optical disk drives, mobile phones, and so on. An electrical connector is a conductive device for connecting electrical circuits together and for allowing electrical signals to pass between the electrical circuits. Therefore, it is necessary to test the electrical connector, in order to assure reliability of the electrical connector.

Printed circuit boards are used for testing electrical connectors in a testing device. Most electrical connectors include an insulating housing and a plurality of pins accommodated in the insulating housing. One end of each pin is electrically connected to the printed circuit board, and the other end of the pin is exposed to the air.

In addition to the printed circuit board, the testing device includes an oscillograph and a pair of leads. One end of each lead is inserted into the oscillograph, while the other end of the lead is used for electrically contacting with the exposed pins of the electrical connector. Usually the other ends of the pair of leads include two probes or two clips. If probes are used, users need to physically hold the probes against the exposed pin to establish an electrical connection. However, when holding the probes against the pins the probes may slide or skid over the pins resulting in erroneous results. If clips are used, each clip is clipped to a pin to establish an electrical connection. However, when clipping two adjacent pins the distance between the pins maybe so small that the clips may touch each other resulting in erroneous results.

Therefore, an adaptor and a testing device are needed in the industry to address the aforementioned deficiencies and inadequacies.

SUMMARY OF THE INVENTION

An adaptor for electrically connecting with pins of an electrical connector. The adaptor includes an insulating housing, a pair of crimping connectors, and two connecting members. The insulating housing includes two holes. The crimping connectors are accommodated respectively in the holes. Each crimping connector includes a first crimping portion for electrically connecting to one of the pins and a second crimping portion together formed with the first crimping portion. The connecting members are electrically connected with the crimping connectors respectively. Each connecting member includes a first end, a cable, and a second end. The first end is electrically connected with the second crimping portion. The cable is electrically connected with the first end. The second end is electrically connected with the cable, wherein the second end has a through hole. A testing device for testing the electrical connector is also disclosed.

Other systems, methods, features, and advantages of the present adaptor and the present testing device will be or become apparent to one with skill in the art upon examination of the following drawings and detailed description. It is intended that all such additional systems, methods, features, and advantages be included within this description, be within the scope of the present device, and be protected by the accompanying claims.

BRIEF DESCRIPTION OF THE DRAWINGS

Many aspects of the present adaptor and the present testing device can be better understood with reference to following drawings. Components in the drawings are not necessarily to scale, emphasis instead being placed upon clearly illustrating the principles of the present device. Moreover, in the drawings, like reference numerals designate corresponding parts throughout the several views.

DETAILED DESCRIPTION OF THE INVENTION

Reference will now be made to the drawings to describe a preferred embodiment of the present adaptor and a preferred embodiment of the present testing device.

Figure 1:
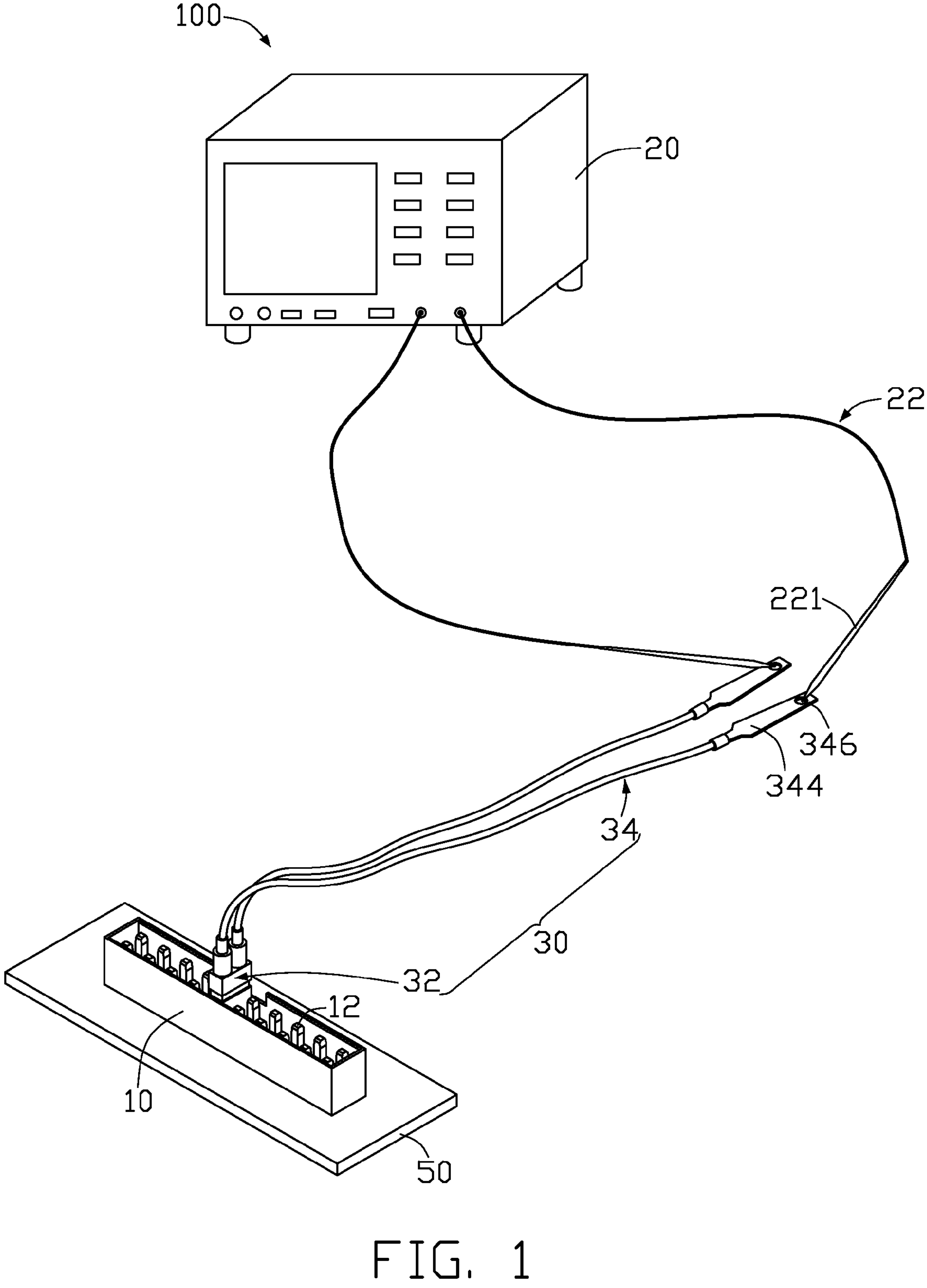
FIG. 1 is a schematic diagram showing a testing device in accordance with an exemplary embodiment and a electrical connector, the testing device including an adaptor.

Referring to FIG. 1, a testing device 100 in accordance with a preferred exemplary embodiment is used for testing an electrical connector 10 of a printed circuit board 50. The electrical connector 10 includes a plurality of pins 12. The testing device 100 includes an oscillograph 20, a pair of leads 22, and an adaptor 30. In the embodiment, the pair of leads 22 connects to a pair of probes 221 correspondingly.

The adaptor 30 includes a female connector 32, a pair of paddle connectors 344, and a pair of connecting members 34. Also referring to FIG. 2, each connecting member 34 includes a first end 342 connected to the female connector 32, and a cable 340 connected to the first end 342. Each paddle connector 344 can also be depicted as a second end 344 of the connecting member 34. The female connector 32 is for electrically connecting with the pins 12 of the electrical connector 10 when the testing device 100 tests the electrical connector 10. The pair of paddle connectors 344 is for electrically contacting with the pair of probes 221 correspondingly to test the electrical connector 10.

Figure 2:
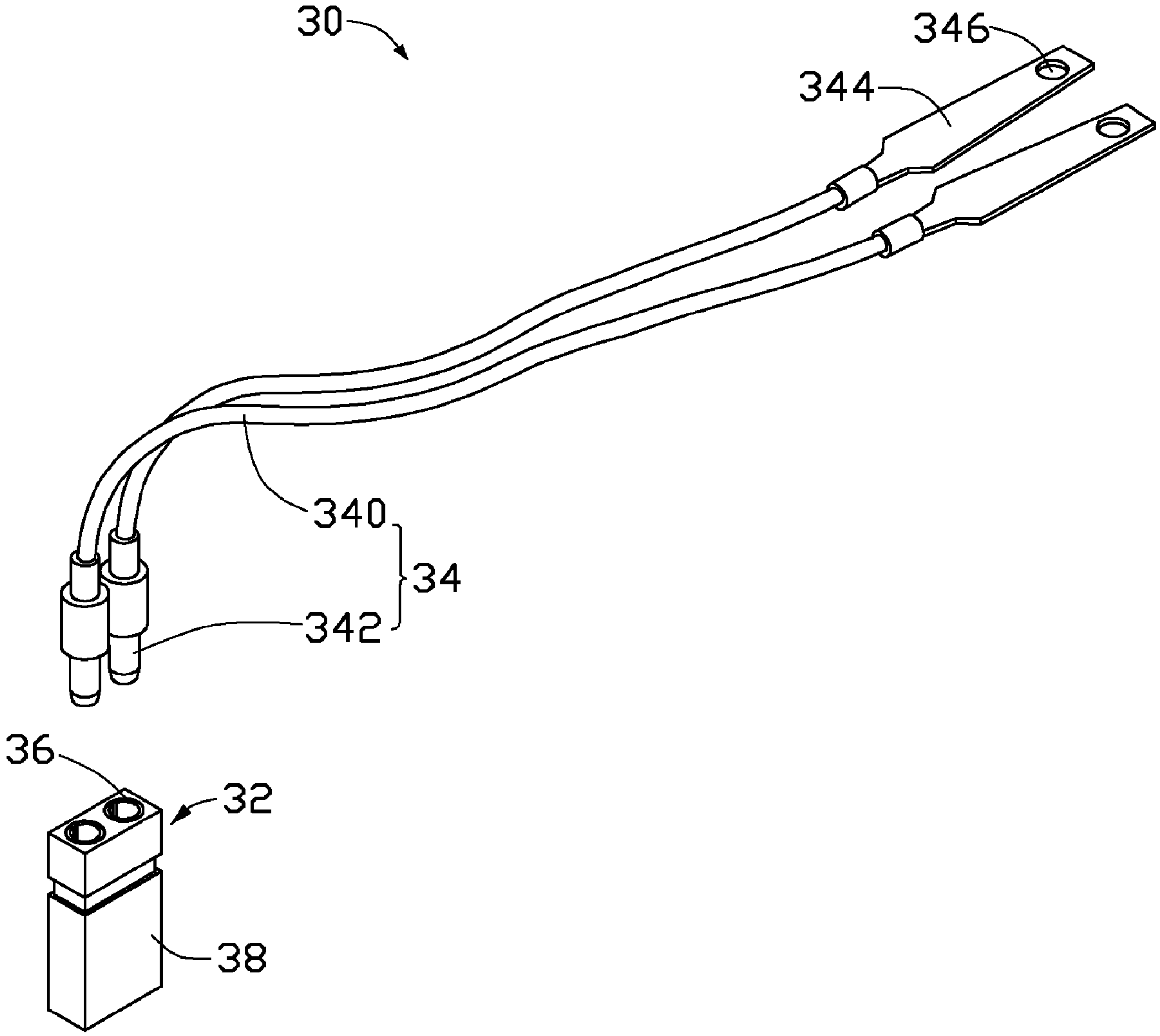
FIG. 2 is a disassembled, schematic diagram showing the adaptor of FIG. 1, the adaptor including a female connector and pair of cables.
Figure 3:
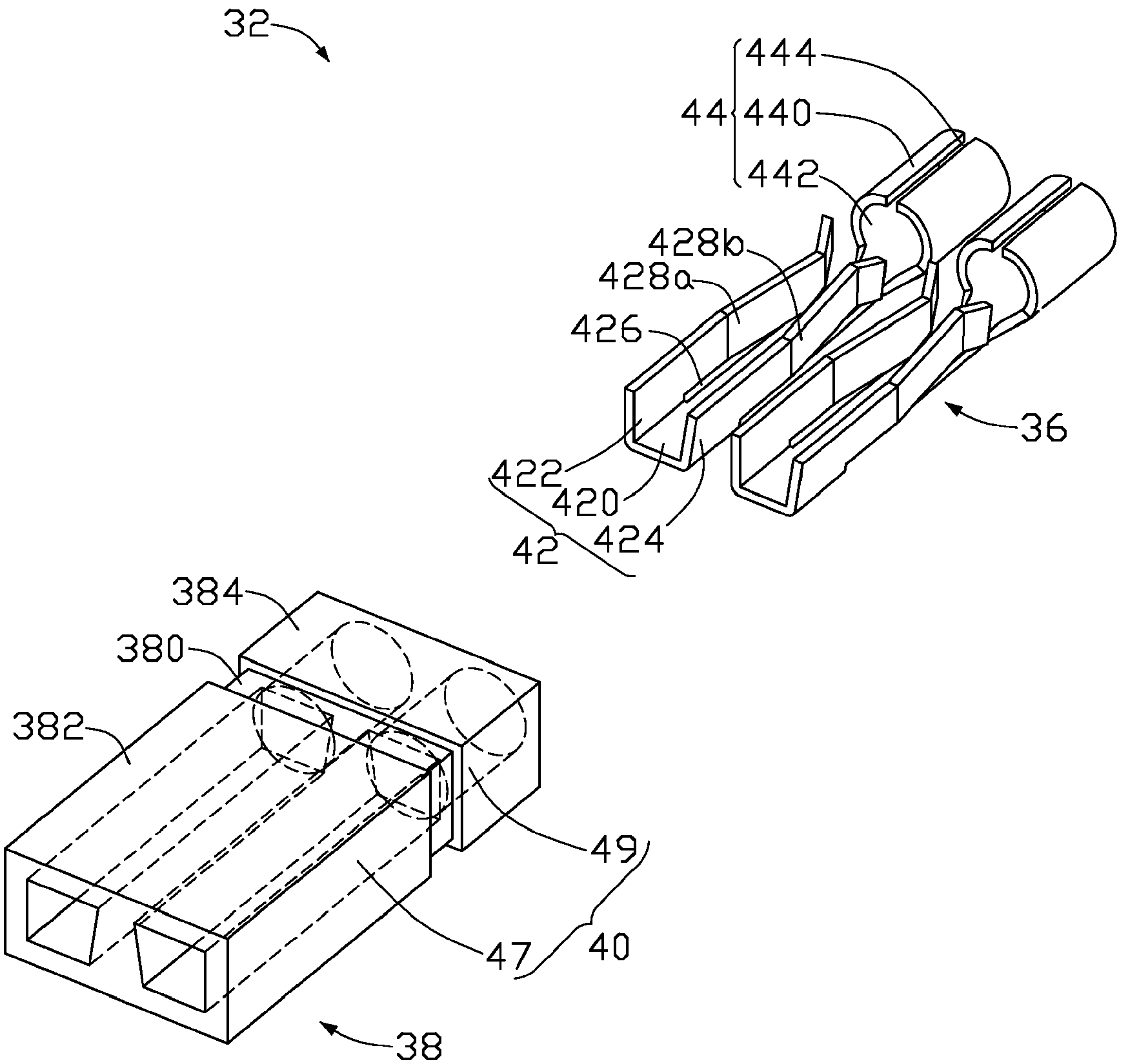
FIG. 3 is a disassembled, schematic diagram showing the female connector of FIG. 2.

Referring to FIGS. 2 and 3, the female connector 32 includes a pair of crimping connectors 36 made of metal material and an insulating housing 38 for protecting the crimping connectors 36. The insulating housing 38 defines a pair of through holes 40 with size and shape for accommodating the crimping connectors 36 correspondingly.

Each crimping connector 36 includes a first crimping portion 42 and a second crimping portion 44 integrally formed with the first crimping portion 42. The first crimping portions 42 are for electrically connecting with the pins 12 of the electrical connector 10. The second crimping portions 44 are for electrically connecting with the first ends 342 of the connecting members 34 of the adaptor 30 correspondingly.

The first crimping portion 42 includes a base-sheet 420 extending from the second crimping portion 44. Two sidewalls 422, 424 extend upwards from the base-sheet 420, and are separate from the second crimping portion 44. That is, gaps are defined between the sidewalls 422, 424 and the second crimping portion 44. A pair of slits 426 is defined partially between the base-sheet 420 and each of the sidewalls 422, 424 and communicates with the gaps between the sidewalls 422, 424 and the second crimping portion 44 correspondingly. Hence the sidewalls 422, 424 form two clipping arms 428*a*, 428*b*. The clipping arms 428*a*, 428*b* bend inwardly toward each other at a first predetermined position and then bend outwardly away from each other at a second predetermined position near the second crimping portion 44.

When the adaptor 30 is connected to the electrical connector 10, the female connector 32 is sleeved onto adjacent pins 12. The pins 12 are thus inserted into the crimping connector 36, the clipping arms 428*a*, 428*b* of each of the crimping connector 36 are pushed away from each other by the pins 12. Therefore, the clipping arms 428*a*, 428*b* resiliently clip the pin 12, thus, obtaining a strong connection between them.

The second crimping portion 44 is tubular in shape. The second crimping portion 44 mainly includes a cannular casing 440, thus, defining a cavity 442 within the cannular casing 440. A gap 444 is defined directly across two ends of the cannular casing 440. The gap 444 enables the cannular casing 440 to deform resiliently.

The insulating housing 38 is substantially a rectangular box. The insulating housing 38 includes a neck portion 380, a first accommodating portion 382, and a second accommodating portion 384. Corresponding to a structure of the crimping connector 36, each of the through holes 40 includes a square portion 47 and a circular portion 49. That is, the square portion 47 is for accommodating the first crimping portion 42, and the circular portion 49 is for accommodating the second crimping portion 44.

As described above, each connecting member 34 includes the cable 340, the first end 342, and the paddle connector 344. The first end 342 is cylindrical and the diameter of the first end 342 is greater than a diameter of the second crimping portion 44. When the first end 342 is inserted into the cavity 442 of the second crimping portion 44, the cannular casing 440 is forced to deform resiliently. A stable electrical connection is generated between the first end 342 and the cannular casing 440. Each paddle connector 344 has a through hole 346. In practice, the pair of probes 221 of the leads 22 is positioned in the through holes 346, thus avoiding the pair of probes 221 from disengaging with the paddle connectors 344.

When the testing device 100 is used to test the electrical connector 10, the female connector 32 is electrically connected to the pins 12 by inserting the pins 12 into the first crimping portions 42 of the crimping connectors 36. The clipping arms 428*a*, 428*b* clips one of the pins 12 stably. The pair of probes 221 of the leads 22 is positioned in the through holes 346 of the connecting members 34 respectively to get nonskid connections therebetween.

As mentioned above, the adaptor 30 is used to connect the testing device 100 with the electrical connector 10. The female connector 32 of the adaptor 30 is used to connect to the pins 12 of the electrical connector 10, and the connecting members 34 are used for contacting with the probes 221 of the leads 22. Therefore, the leads 22 don't need to directly connect to the pins 12. No matter what type of the leads 22 are used, clips or probes, the leads 22 can be positioned in the connecting members 34 without handhold, skid, and a risk of error connection.

Furthermore, in other embodiments, the female connector 32 of the adaptor 30 can consist of two parts. Each of the parts includes an independent insulating housing and an independent crimping connector. Therefore, each of the parts of the female connector 32 can be connected to a corresponding pin separately.

It should be emphasized that the above-described preferred embodiment, is merely a possible example of implementation of the principles of the invention, and is merely set forth for a clear understanding of the principles of the invention. Many variations and modifications may be made to the above-described embodiment of the invention without departing substantially from the spirit and principles of the invention. All such modifications and variations are intended to be included herein within the scope of this disclosure and the present invention and be protected by the following claims.

What is claimed is:

1. An adaptor for electrically connecting with pins of an electrical connector, the adaptor comprising:

an insulating housing defining two holes;

a pair of crimping connectors accommodated respectively in the two holes, each crimping connector comprising a first crimping portion for electrically connecting to one of the pins and a second crimping portion together formed with the first crimping portion; and two connecting members electrically connected with the crimping connectors respectively, each connecting member comprising a first end, a cable, and a second end, the first end being electrically connected with the second crimping portion, the cable being electrically connected with the first end, and the second end being electrically connected with the cable, wherein the second end has a through hole.

2. The adaptor according to claim 1, wherein the first crimping portion comprises a base-sheet connected to the second crimping portion, and two sidewalls extending upwards from the base-sheet.

3. The adaptor according to claim 2, wherein two slits are respectively formed between the sidewalls and a part of the base-sheet near the second crimping portion.

4. The adaptor according to claim 2, wherein two clipping arms protrude respectively from the sidewalls towards the second crimping portion.

5. The adaptor according to claim 4, wherein the clipping arms firstly bend towards each other and subsequently bend away from each other along a direction from the first crimping portion to the second crimping portion.

6. The adaptor according to claim 2, wherein gaps are defined between the sidewalls and the second crimping portion.

7. The adaptor according to claim 6, wherein a pair of slits is defined partially between the base-sheet and each of the sidewalls and communicates with the gaps correspondingly.

8. The adaptor according to claim 1, wherein each hole comprises a square portion and a circular portion, and the square portion accommodates the first crimping portion and the circular portion accommodates the second crimping portion.

9. The adaptor according to claim 1, wherein the second crimping portion comprises a cannular casing surrounding a cavity.

10. The adaptor according to claim 9, wherein a gap is defined across two ends of the cannular casing.

11. The adaptor according to claim 1, wherein the first end is a cylinder whose diameter is greater than that of the second crimping portion.

* * * * *